United States Patent [19]
Rordorf

[11] 3,956,652
[45] May 11, 1976

[54] DEVICE ON A METALLIC GAS-DISCHARGE VESSEL FOR CURRENT LEAD-IN THROUGH ITS WALL

[75] Inventor: Horst Rordorf, Weiningen, Switzerland

[73] Assignee: Elektrophysikalische Anstalt Bernard Berghaus, Vaduz, Liechtenstein

[22] Filed: Jan. 28, 1975

[21] Appl. No.: 544,901

[30] Foreign Application Priority Data
Jan. 29, 1974  Switzerland.......................... 1173/74

[52] U.S. Cl. ............................... 313/19; 174/152 E; 313/219; 313/240; 313/268; 313/326; 313/353
[51] Int. Cl.² ..................... H01J 37/04; H01J 37/32
[58] Field of Search ................................ 313/18–21, 313/219, 199, 240, 325, 326, 353, 268; 174/152 R, 152 E

[56] References Cited
UNITED STATES PATENTS

| | | |
|---|---|---|
| 2,701,846 | 2/1955 | Berghaus et al. ..................... 313/19 |
| 2,906,911 | 9/1959 | Bucek ................................. 313/219 |
| 2,929,947 | 3/1960 | Berghaus et al. ..................... 313/19 |
| 3,207,941 | 9/1965 | Flachowsky et al. ................ 313/268 |

Primary Examiner—Siegfried H. Grimm
Attorney, Agent, or Firm—Bacon & Thomas

[57] ABSTRACT

Device on a metallic gas discharge vessel as a current lead-in through its wall. The inner conductor which traverses the container wall is supported by an insulating sleeve. For protection against the action of glow discharges protective gaps are located in front of the insulating sleeve which are formed by an inner insulatedly supported metallic shielding sleeve. A second outer insulatedly arranged shielding sleeve encloses the inner shielding sleeve and forms protective gaps located in front of the inner shielding sleeve. The outer shielding sleeve shields the inner shielding sleeve against the electric field originating from the container wall.

5 Claims, 4 Drawing Figures

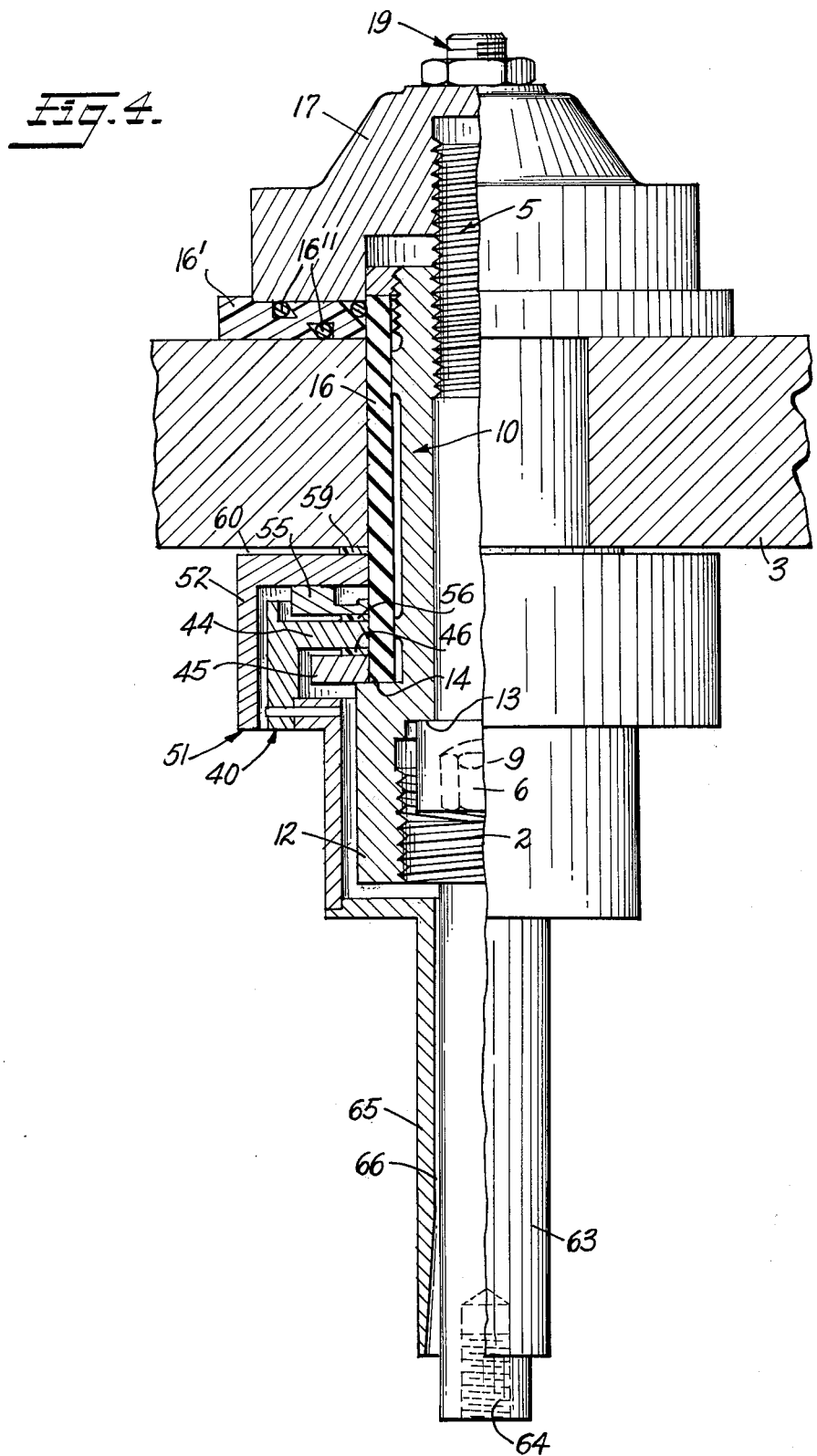

DEVICE ON A METALLIC GAS-DISCHARGE VESSEL FOR CURRENT LEAD-IN THROUGH ITS WALL

The present invention relates to a device on a metallic gas discharge vessel for current lead-in through the wall of the vessel, particularly for processing heavy workpieces by means of glow discharges at high operating voltages, with an inner conductor enclosed by an insulating body, interconnected protective gaps of varying widths and cylindrical and plane configuration being provided in order to shield the insulating body against the action of glow discharges. As is well known, the powerful glow discharge set up in the vessel attacks the insulating material when the workpiece is processed and destroys it in a short space of time. It is also known for the elimination of this difficulty to protect the insulating material by protective gaps located in front of it and between live metallic structural members. Such protective gaps have been given a variety of configurations. By way of example, the patent holder has suggested that the protective gaps be given a funnel-type configuration (U.S. Pat. No. 2,929,947), that discontinuities be provided in the gap (U.S. Pat. No. 2,701,846) or that a separating seam be placed in front of the gap (Canadian Pat. No. 568,592). It is also a known solution to provide at least one insulatedly supported metallic component as one of the protective gap walls as well as flat gaps (U.S. Pat. No. 3,207,941). The use of such metallic neutral protective gap wall portions has stood the test of time but it has been found that they may, under various operating conditions during the processing of the workpiece, accept negative charges which may result in electric flash-overs between the component involved and other live container portions.

The invention is designed to provide a power lead-in which eliminates such flash-overs at high operating voltages up to 1000 Volts and over. Accordingly, the present invention relates to a current lead-in of the type above described which is characterized:

by a mechanically unstressed insulating sleeve as the insulating body which enables the cylindrical inner conductor.

by a metallic insulatedly supported inner shielding sleeve with a free potential which sits on the insulating sleeve with a flange extending radially inwards, which has the underside of its flange resting on a shoulder on the inner conductor via first insulating spacer disc and forms a plane flat gap between the underside of the flange and the shoulder, the said flat gap opening into a widened cylindrical gap portion between the cylindrical inner side of the inner shielding sleeve on the one hand and the outer side of the shoulder and of the inner conductor on the other and which gap portion leads into the interior of the vessel with increasing width.

by at least one metallic insulatedly supported outer shielding sleeve with a free potential which encloses at least part of the inner shielding sleeve without contacting it and has an inwardly extending flange sitting on the insulating sleeve, the said outer shielding sleeve furthermore resting with the upper side of its flange on a second insulating spacer disc which adjoins the vessel wall and forms a plane flat gap between the latter and the upper side of the flange which opens into the interior of the vessel and which outer shielding sleeve has the underside of its flange resting against a third insulating spacer disc which is borne by the flange of the inner shielding sleeve forming a plane flat gap between the flanges of the outer and the inner shielding sleeves which flat gap has its radially outer end opening into a wider cylindrical gap between the cylindrical portions of the outer and the inner shielding sleeves and which cylindrical gap leads into the interior of the vessel, and by the fact that the inner conductor is hollow and provided with a tightening screw extending through it, the said screw being screwed into a cover located outside the vessel wall which cover rests on the vessel wall with an electrically insulating vacuum-tight intermediate layer so that, when the tightening screw is screwed down, the shoulder of the inner conductor forces the spacer discs and the flanges located between them against the container wall.

A number of exemplified embodiments of the invention are described in greater detail with reference to the enclosed drawing in which FIG. 1 is a section of a device used for current lead-in;

FIG. 3 is a section of a preferred embodiment of the gap arrangement for mounting in the holding member according to FIG. 1, and FIG. 4 a further embodiment of a current lead-in.

Figure 1:
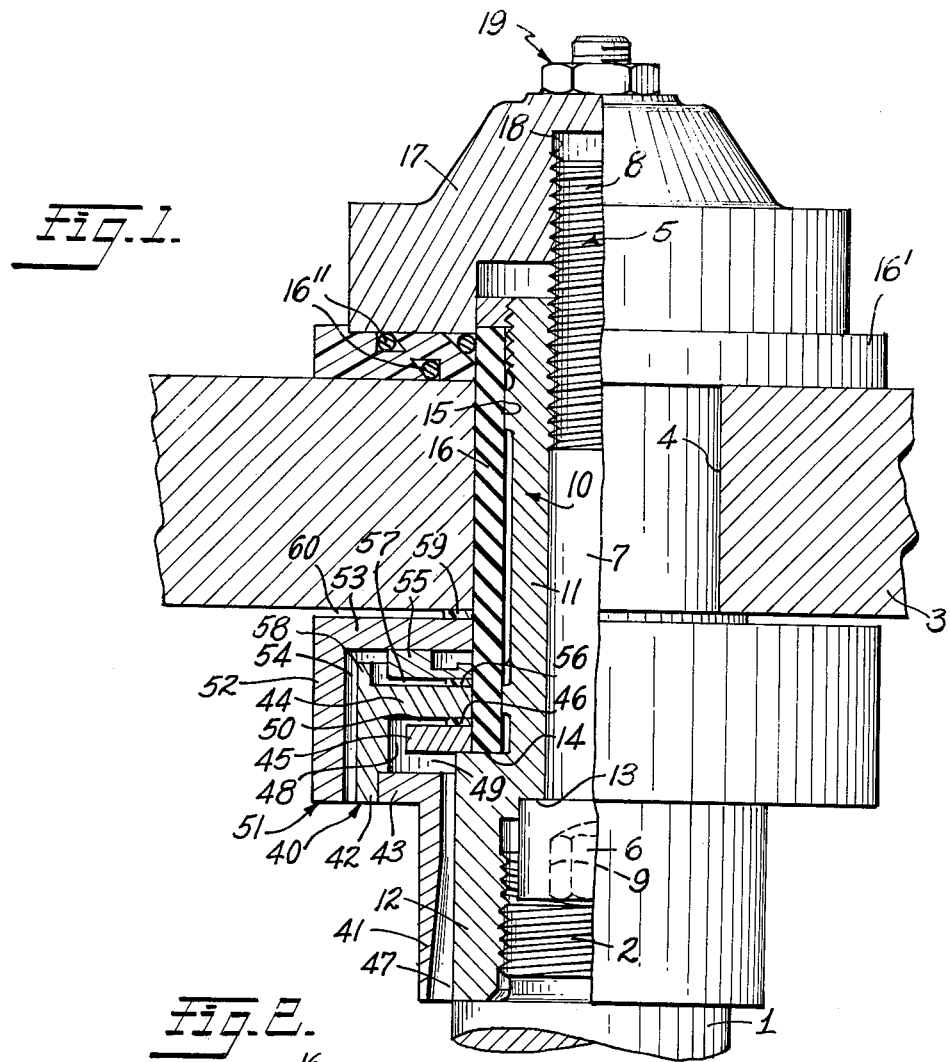

The device used as a current lead-in according to the embodiment shown in FIG. 1 is at the same time designed as a holder for the workpieces to be treated and accordingly dimensioned for loads of several hundred kilograms. The carrier bolt 1 is provided for the suspension of the load and carries the workpieces as by means of the device proposed in U.S. Pat. No. 3,865,451. The carrier bolt 1 can be removed by means of a threaded connection 2 from the inner conductor described in greater detail below which at least temporarily carries a negative voltage relative to the vessel wall 3 of the ionitriding furnace e.g. in ionitriding. As a lead-in for the inner conductor the bore 4 is provided in the vessel wall 3, particularly in the vessel cover. The inner conductor consists of a metallic cylindrical tube 10 and a tightening bolt 5 slidably arranged therein. Viewed in the direction from the interior of the vessel the tightening bolt 5 comprises a bolt shank 7 and a bolt thread 8 at the upper end of the bolt that projects from the vessel. The cylindrical tube 10 consists of an upper narrow portion 11 and a wider portion 12 located in the interior of the vessel. The point of transition from the two tube portions 11 and 12 forms inner and outer horizontal shoulders 13, 14. The cylindrical tube 10 sits on the bolt head 6 by its inner shoulder 13. The upper portion of the cylindrical tube 11 is enclosed by an electrically insulating sleeve 16 which rests on the outer shoulder 14 and preferably consists of a ceramic material. Formed on the outside of the upper portion of the cylindrical tube 11 are projecting contact surfaces 13 which constitute a reduction of the contact surfaces between the insulating sleeve 16 and the cylindrical tube 10, thus reducing the undesirable heating of the insulating sleeve 16.

As will be described in yet greater detail below, the insulating sleeve 16 is enclosed, between the vessel wall 3 and the upper edge of the shoulder 14, by the protective gap arrangement of which the components are forced against the vessel wall 3 by the shoulder 14. The metallic cover 17 serving to close the vessel bore 4 incorporates a threaded bore 18 for insertion of the tightening bolt 5 and attaching means 19 for connecting the power supply. Located between the cover 17 and the vessel wall 3 is an electrically insulating ring 16' which encloses the insulating sleeve 16. O-rings 16'' are fitted in the insulating ring 16' to seal off the vacuum existing in the interior of the vessel during operation. For the purpose of assembling the current lead-in from the inside, the bolt head 6 is provided with a hexagonal socket 9. When the tightening bolt 5 is screwed into the cover 17 the bolt head 6 compresses the protective gap arrangement previously referred to via the shoulders 13, 14 of the cylindrical tube. It can be seen from the above and on condition that all components are machined to dimension that the insulating sleeve 16 is advantageously not stressed by longitudinal or transverse loads.

Figure 2:
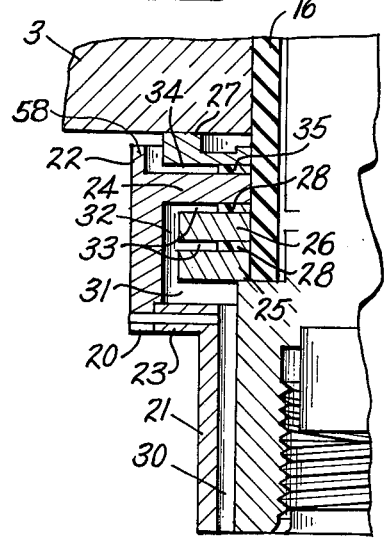
FIG. 2 is a section through a prior art gap arrangement.

FIG. 2 shows a known protective gap arrangement designed according to the principles so far applicable. One wall of the protective gap is formed by a metallic insulatedly supported no-potential shielding sleeve 20. The shielding sleeve 20 is composed of a narrow lower portion 21 and wide upper portion 22, a horizontal member 23 connecting the sleeve portions, and a disc-shaped inwardly directed sleeve flange 24 which adjoins the upper sleeve portion 22 and stands vertically on the insulating sleeve 16. The interspace between the sleeve flange 24 and the edge of the shoulder 14 is filled by two metal rings 25, 26 and spacer discs 28 arranged between them which are electrically insulating and preferably formed of mica. A further metal ring 27 is located between the sleeve flange 24 and the vessel wall 3. The shape of the shielding sleeve 20 and the position of the metal rings 25, 26 provide a protective gap with a lower vertical cylindrical gap section 30 which opens into a horizontal flat gap 31 followed by a further upper vertical cylindrical gap section 32. Preferably narrow horizontal flat gaps 33 defined by the thickness of the spacer discs 28 open into the upper vertical gap section. The sleeve flange 24 and the metal ring 27 are separated by the insulating spacer discs 35 and form a further flat gap 34.

As is well known, such changes in the direction of gaps and openings of flat gaps constitute discontinuities for the glow light which creeps upwardly through the gap, and cause it to disrupt. The empirically determined configuration of the shielding sleeve 20 has thus also proved its value with the exception of the hazard of flash-overs to the wall 3 because the intensive glow discharge present in the lower vertical gap section results in a high potential of the shielding sleeve 20 relative to the container wall 3. This is why an electrical field is created between the container wall 3 and adjacent portions of the shielding sleeve 20 which, if sufficiently strong, results in a flash-over which may in turn cause an arc discharge.

Figure 3:
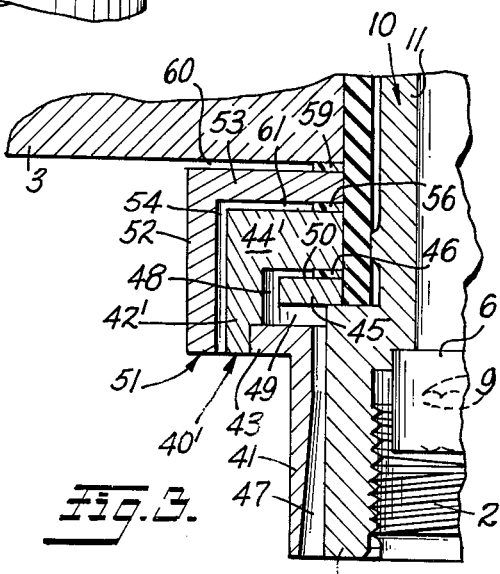

The preferred measure to avoid such flash-overs is shown in the gap arrangements according to FIGS. 1 and 3. In principle, at least a second outer no-potential shielding sleeve 51 is provided which shields the shielding sleeve 40 and 40' respectively now designated as the "inner" one for distinction, relative to the components carrying a positive voltage, by way of example the vessel wall 3. The empirically determined configuration of the shielding sleeve and its location relative to the other components of the gap arrangement are here of particular importance.

In the embodiment according to FIG. 1 the inner shielding sleeve 40 is shaped similar to the shielding sleeve 20 of FIG. 2 previously described. It consists of the narrow lower sleeve portion 41 and the wide upper sleeve portion 42 and a horizontal portion 43 which connects the sleeve portions. Connected to the upper end of the sleeve portion 42 is an inwardly directed disc-type sleeve flange 44 resting vertically on the insulating sleeve. Sitting on the outer shoulder 14 is a metal ring 45 on which in turn rests the electrically insulating spacer disc 46. The spacer disc 46 insulates the shielding sleeve 40 against the negative voltage and separates the sleeve flange 44 from the metal ring 45 at the same time forming a narrow upper flat gap 50. The flat gap 50 opens into an upper cylindrical gap section 48 between the metal ring 45 and the upper sleeve portion 42. The gap portion passes into a lower wider flat gap 49 which opens into the lower cylindrical gap portion 47. The gap portion 47 is formed between the tube portion 12 and the lower sleeve portion 41 and widens in the direction of the interior of the container owing to a bevelled section of the sleeve portion 41.

An outer insulatedly supported metallic cup-shaped shielding sleeve 51 comprises the sleeve portion 52 and the sleeve flange 53. The sleeve portion 52 envelopes the upper sleeve portion 42 of the inner shielding sleeve 40 and forms therebetween the cylindrical gap 54. The sleeve flange 53 stands vertically on the insulating sleeve 16 and is carried at its underside by a metallic supporting ring 55. The supporting ring 55 sits, via an insulating spacer disc 56, on the sleeve flange 44 of the inner shielding sleeve 40. The spacer disc 56 forms a flat gap 57 between the supporting ring 55 and the sleeve flange 44. This flat gap 57 opens into the cylindrical gap 54 via a bend caused by the extension 58 of the sleeve portion 42.

In the preferred embodiment according to FIG. 3 the supporting ring 55 is omitted so that the outer shielding sleeve 51 is carried directly by the inner shielding sleeve 40' by the underside of its sleeve flange 53 via the spacer disc 56. The two sleeve flanges 44' and 53 thus enclose a narrow horizontal flat gap 61. The sleeve portion 42' is not provided with an extension 58 as in FIG. 2 so that the flat gap 61 opens into the cylindrical gap 54 without a bend. All other components of FIG. 3 are designed in accordance with the gap arrangement of FIG. 1 so that similar reference numerals are used therefor and a detailed description is not necessary. The sleeve flange 53 of the outer shielding sleeve 51 is separated from the vessel wall 3 by the insulating spacer disc 59 so that a further flat gap 60 is formed.

It can be seen that the outer shielding sleeve 51 shields the inner shielding sleeve 40 relative to the electric field created by the vessel wall 3 and that the efficacy of the shield depends on the design of the shielding components relative to those to be shielded. A significant structural measure consisted in that the points of contact of the inner shielding sleeve with other components are protected by protective gaps 54, 57, 60, 61 located in front of them. In the present embodiment, empirically determined configurations of the inner and outer shielding sleeves are represented. The generalized rule is that an inner insulatedly supported metallic component which forms one wall of a protective gap is enclosed by at least one outer insulatedly supported metallic component so that all points of high mutual potential are avoided by subdivisions into steps.

For high voltages e.g. above 1000 Volts and workpieces of the type that are not to be suspended from the current lead-in but borne by the container bottom, particularly for heavy workpieces, the current lead-in device shown in FIG. 4 is provided. Instead of the carrier bolt 1 shown in FIG. 1, an interior conductor extension 63 is mounted in the cylindrical tube portion 12 by means of the threaded connection 2. The lower end of the inner conductor extension 63 is located in the vicinity of the material to be ionitrided and provided with a threaded connection 64 for the workpieces. An inner conductor sleeve 65 designed as part of the inner shielding sleeve 40 encloses the inner conductor. Formed between the inner conductor extension 63 and the inner conductor sleeve 65 is a protective gap 66 of which the lower end widens in the manner of a funnel and opens into the interior of the container. Discharge at the point of connection 64 occurs with the same power density as at the workpieces so that the connecting point 64 has the same temperature as the workpieces. Owing to the relatively great distance between the connecting point 64 and the heat-sensitive portions of the current lead-in they are not adversely affected by the rising heat so that this current lead-in is particularly suited for workpiece treatment at high temperatures and high voltages respectively.

What I claim is:

1. A device on a metallic gas discharge vessel used as a current lead-in through the vessel wall, particularly for the treatment of heavy workpieces by means of glow discharges at high operating voltages, with a cylindrical inner conductor (5, 10) enclosed by an insulating body (16), communicating protective gaps of different widths and cylindrical configuration being provided in order to protect the insulating body (16) against the action of glow discharges, comprising:
    a mechanically unstressed insulating sleeve (16) as an insulating body which encloses the cylindrical inner conductor (5, 10).
    a metallic insulatedly supported inner shielding sleeve (40) with a free potential which sits on the insulating sleeve (16) with a flange (44) extending radially inwards, which has the underside of its flange resting on a shoulder (13, 14) on the inner conductor via a first insulating spacer disc (46) and forms a plane flat gap (50) between the underside of the flange and the shoulder, the said first gap (50) opening into a wider cylindrical gap portion (48) between the cylindrical inner side of the inner shielding sleeve (40) on the one hand and the outer side of the shoulder (13, 14) and of the inner conductor on the other, and which gap portion (48) leads into the interior of the vessel with an increasing width,
    at least one metallic insulatedly supported outer shielding sleeve (51) with a free potential which encloses at least part of the inner shielding sleeve (40) without contacting it and which has an inwardly extending flange (53) sitting on the insulating sleeve (16), the said outer shielding sleeve (51) resting with the upper side of its flange on a second insulating spacer disc (59) which adjoins the vessel wall (3) and forms a plane flat gap (60) between the latter and the upper side of the flange which opens into the interior of the vessel and which outer shielding sleeve (51) has the underside of its flange resting against a third insulating spacer disc (56) which is borne by the flange (44) of the inner shielding sleeve (40) forming a plane flat gap (57, 61) between the flanges of the outer and the inner shielding sleeves which flat gap (57, 61) has its radially outer end opening into a wider cylindrical gap (54) between the cylindrical portions (52, 42) of the outer and the inner shielding sleeve and which cylindrical gap (54) leads into the interior of the vessel,
    and the inner conductor herein being hollow and provided with a tightening screw (5) extending through it, the said screw being screwed into a cover (17) located outside the container wall with an electrically insulating vacuum-tight intermediate layer (16') so that, when the tightening screw is screwed down, the shoulder (13, 14) of the inner conductor forces the spacer discs (46, 56, 59) and the flanges located between them (44, 53) against the vessel wall.

2. A device according to claim 1 wherein the inner lead (5, 10) is formed by a cylindrical tube (10) and the tightening screw (5) extends through the latter, the said cylindrical tube comprising a narrow tube portion (11) extending through the container wall (3) and a tube portion (11) wider in the interior of the vessel, the said shoulder (13, 14) being located at the point of connection of the two tube portions (11, 12) the insulating sleeve (16) enclosing the narrow tube portion (11) and resting on the shoulder (13, 14).

3. A device according to claim 1 characterized by a metal ring (45) between the first spacer disc (46) and the shoulder (13, 14).

4. A device according to claim 1 characterized by a metal ring (55) between the third spacer disc (56) and the flange (53) of the outer shielding sleeve (51).

5. A device according to claim 2 characterized by an inner conductor extension (63) attached to the wide cylindrical tube portion (12) for the treatment of workpieces supported by the container bottom and by an inner conductor sleeve (65) enclosing the inner conductor extension which is part of the inner shielding sleeve (40) and encloses a protective gap (66) with the inner conductor extension.

* * * * *